(12) United States Patent
Nakazawa et al.

(10) Patent No.: US 7,531,408 B2
(45) Date of Patent: May 12, 2009

(54) METHOD OF MANUFACTURING A SEMICONDUCTOR DEVICE CONTAINING A $PB_xSR_{(1-x)}[ZR,TI]_xRU_{(1-x)}O_3$ FILM IN A CAPACITOR

(75) Inventors: Keisuke Nakazawa, Tokyo (JP); Koji Yamakawa, Tokyo (JP); Katsuaki Natori, Yokohama (JP); Soichi Yamazaki, Yokohama (JP); Hiroshi Itokawa, Yokohama (JP); Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/754,022

(22) Filed: May 25, 2007

(65) Prior Publication Data

US 2007/0231948 A1 Oct. 4, 2007

Related U.S. Application Data

(62) Division of application No. 10/833,096, filed on Apr. 28, 2004, now Pat. No. 7,233,040.

(30) Foreign Application Priority Data

Sep. 10, 2003 (JP) ............................. 2003-318393

(51) Int. Cl.
 *H01L 21/8234* (2006.01)
(52) U.S. Cl. ......................................... 438/240; 438/3
(58) Field of Classification Search ................. 438/238, 438/240, 3
See application file for complete search history.

(56) References Cited

U.S. PATENT DOCUMENTS

| 5,879,956 A | 3/1999 | Seon et al. |
| 6,194,228 B1 | 2/2001 | Fujiki et al. |
| 6,351,006 B1 | 2/2002 | Yamakawa et al. |

FOREIGN PATENT DOCUMENTS

| JP | 2000-144264 | 5/2000 |
| JP | 2000-208725 | 7/2000 |
| JP | 2000-252444 | 9/2000 |

*Primary Examiner*—Thanh Nguyen
(74) *Attorney, Agent, or Firm*—Oblon, Spivak, McClelland, Maier & Neustadt, P.C.

(57) ABSTRACT

A method of manufacturing a semiconductor device, including forming a capacitor above a semiconductor substrate, the capacitor including a dielectric film containing Pb, Zr, Ti and O. Forming the capacitor includes forming a crystallized film which contains Pb, Sr, Zr, Ti, Ru and O.

5 Claims, 8 Drawing Sheets

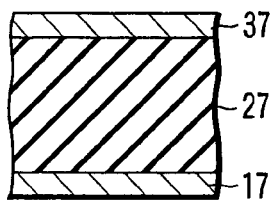
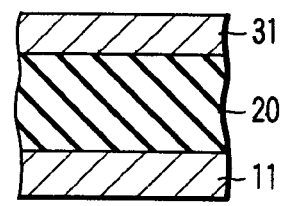
F I G. 10A　　　　F I G. 10B
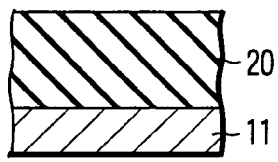
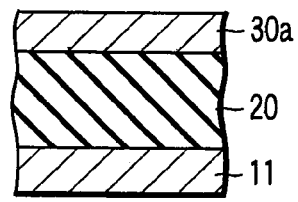
F I G. 11A　　　F I G. 11B　　　F I G. 11C
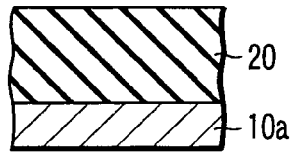
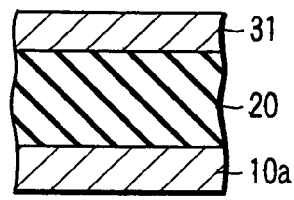
F I G. 12A　　　F I G. 12B　　　F I G. 12C
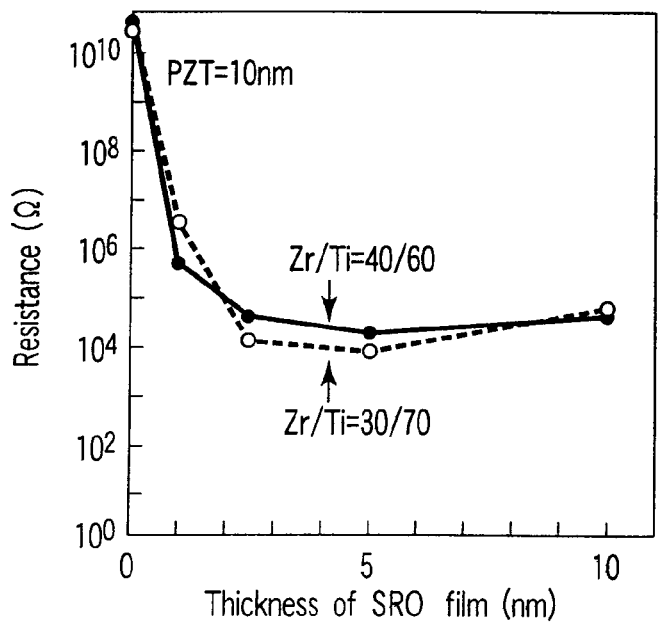
F I G. 13

US 7,531,408 B2

METHOD OF MANUFACTURING A SEMICONDUCTOR DEVICE CONTAINING A $PB_XSR_{(1-X)}[ZR,TI]_XRU_{(1-X)}O_3$ FILM IN A CAPACITOR

CROSS-REFERENCE TO RELATED APPLICATIONS

This application is a division of and claims the benefit of priority under 35 U.S.C. §120 from U.S. Ser. No. 10/833,096, filed Apr. 28, 2004, and claims the benefit of priority under 35 U.S.C. §119 from prior Japanese Patent Application No, 2003-318393, filed Sep. 10, 2003, the entire contents of these applications are incorporated herein by reference.

BACKGROUND OF THE INVENTION

1. Field of the Invention

The present invention relates to a semiconductor device having capacitors and a method of manufacturing the semiconductor device.

2. Description of the Related Art

In recent years ferroelectric memories such as ferroelectric random access memories (FeRAMs) have been developed. A ferroelectric memory comprises capacitors each having a ferroelectric film used as dielectric film.

A ferroelectric memory has been proposed in which the ferroelectric film is a PZT ($Pb(Zr_xTi_{1-x})O_3$: 0<x<1) film and the bottom electrode and top electrode are SRO ($SrRuO_3$) films. (See, for example, U.S. Pat. No. 6,351,006 and U.S. Pat. No. 6,194,228.) This structure can improve the fatigue characteristic of each capacitor incorporated in the ferroelectric memory.

However, the elements contained in the PZT film are different from those contained in the SRO film, except oxygen. Therefore, electric charge is likely to accumulate in the interface between the PZT film and the SRO film. The capacitor may therefore be deteriorated in terms of retention characteristic and imprint characteristic. If the SRO film is formed by sputtering, its crystal orientation will be at random. Hence, any PZT film formed on the SRO film inevitably has random crystal orientation, due to the random crystal orientation of the SRO film. Accordingly, the capacitor cannot undergo so prominent polarization as is desired.

Conventional capacitors, each having a PZT film used as ferroelectric film and SRO films used as electrode films, undergoes but insufficient polarization and may be deteriorated in retention characteristic and imprint characteristic. It has been difficult to provide capacitors that are as reliable as desired and have good characteristics.

BRIEF SUMMARY OF THE INVENTION

A first aspect of the invention, there is provided a semiconductor device comprising: a semiconductor substrate; and a capacitor provided above the semiconductor substrate and including a film which contains Pb, Sr, Zr, Ti, Ru and O and a dielectric film which contains Pb, Zr, Ti and O and which is provided on the film containing Pb, Sr, Zr, Ti, Ru and O.

A second aspect of the invention, there is provided a semiconductor device comprising: a semiconductor substrate; and a capacitor provided above the semiconductor substrate and including a dielectric film which contains Pb, Zr, Ti and O and a film which contains Pb, Sr, Zr, Ti, Ru and O and which is provided on the dielectric film.

A third aspect of the invention, there is provided a method of manufacturing a semiconductor device, comprising forming a capacitor above a semiconductor substrate, the capacitor including a dielectric film containing Pb, Zr, Ti and O, wherein forming the capacitor includes forming a crystallized film which contains Pb, Sr, Zr, Ti, Ru and O.

BRIEF DESCRIPTION OF THE SEVERAL VIEWS OF THE DRAWING

FIGS. 10A and 10B are sectional views schematically explaining a method of manufacturing a capacitor according to an embodiment of the invention FIGS. 11A to 11C are sectional views schematically explaining a method of manufacturing a capacitor according to an embodiment of the invention;

FIGS. 12A to 12C are sectional views schematically explaining a method of manufacturing a capacitor according to an embodiment of the invention;

FIG. 13 is a diagram representing the electrical characteristic of a PSZTR film according to an embodiment of the invention;

DETAILED DESCRIPTION OF THE INVENTION

Embodiments of the present invention will be described, with reference to the accompanying drawings.

Figure 1:
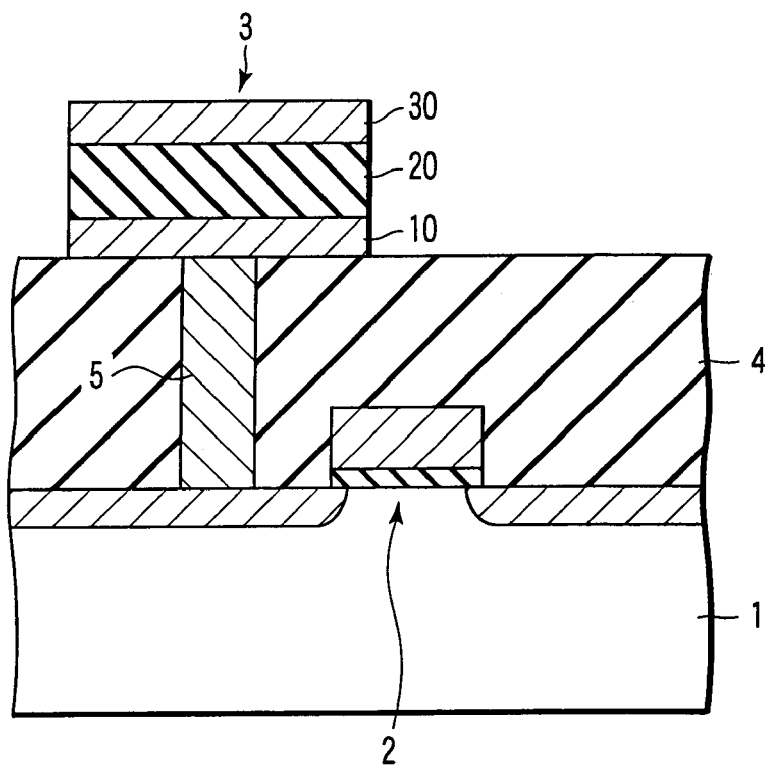
FIG. 1 is a sectional view that schematically illustrates a semiconductor device according to an embodiment of the present invention.

FIG. 1 is a sectional view that schematically illustrates a semiconductor device according to an embodiment of the present invention.

The semiconductor device (semiconductor integrated circuit) comprises a semiconductor substrate 1 (silicon substrate or the like) provided with a MIS transistor 2 and a capacitor 3 provided above the substrate 1. The capacitor 3 comprises a lower structure 10, a dielectric film 20 and an upper structure 30. The lower structure 10 includes a bottom electrode. The upper structure 30 includes a top electrode. The dielectric film 20 is interposed between the lower structure 10 and the upper structure 30. An interlayer insulating film 4 or the like is provided between the semiconductor substrate 1 and the capacitor 3. A plug 5 is formed in the interlayer insulating film 4 and electrically connects the capacitor 3 to a MIS transistor 2.

The dielectric film 20 is a ferroelectric film that contains Pb (lead), Zr (zirconium), Ti (titanium) and O (oxygen). A representative example of the ferroelectric film is a PZT (Pb$(Zr_xTi_{1-x})O_3$) film. The PZT film may contain an element such as La (lanthanum), Sr (strontium) or Ca (calcium).

The lower structure 10 or the upper structure 30, or both, include a film that contains Pb (lead), Sr (strontium), Zr (zirconium), Ti (titanium), Ru (ruthenium) and O (oxygen). A representative example of this film is a $Pb_xSr_{(1-x)}Zr_yTi_zRu_{(1-y-z)}O_3$ film (where, 0<x<1, 0<y<1, 0<z<1, y+z<1). It has perovskite crystal structure. Hereinafter, the film containing Pb, Sr, Zr, Ti, Ru and O will be called "PSZTR film" for the sake of convenience. The composition ratio between the elements contained in the PSZTR film may be constant in the direction of thickness of the film. Alternatively, the composition ratio may vary in the direction of thickness of the film. The conductivity of the PSZTR film varies with the condition of forming the film. Hence, the PSZRT film may be a conductor in some cases, may be a dielectric in some other cases, or may include a conductive part and a dielectric part in other cases.

FIGS. 2A to 2D are sectional views schematically showing, respectively, various capacitors that may be used as capacitor 3 shown in FIG. 1.

Figure 2A:
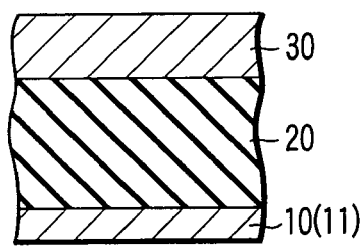
FIGS. 2A to 2D are sectional views schematically showing, respectively, capacitors according to an embodiment of the invention.

FIG. 2A depicts a capacitor whose lower structure 10 is a PSZTR film 11. A dielectric (PZT) film 20 is formed on the PSZTR film 11, and the upper structure 30 is formed on the dielectric film 20. In this capacitor, the PSZTR film 11 functions as bottom electrode.

Figure 2B:
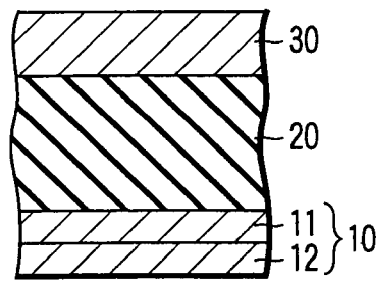

FIG. 2B shows a capacitor whose lower structure 10 is a stacked film composed of a PSZTR film 11 and a conductive film 12. The conductive film 12 contains Sr, Ru and O. Its representative example is an SRO ($SrRuO_3$) film. In this capacitor, at least the conductive film 12 serves as bottom electrode. The PSZTR film 11 may be a conductor in effect. In this case, the PSZTR film 11 functions as bottom electrode, too.

Figure 2C:
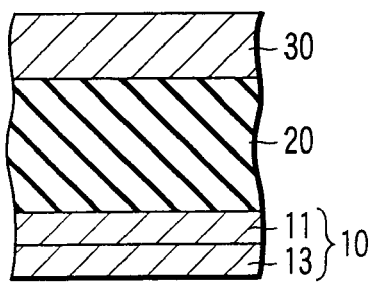

FIG. 2C illustrates a capacitor whose lower structure 10 is a stacked film composed of a PSZTR film 11 and a conductive film 13. The conductive film 13 is a metal film or a metal compound film. The metal film can be platinum (Pt) film, iridium (Ir) film or titanium (Ti) film. The metal compound film can be iridium oxide ($IrO_2$) film. Hereinafter, the conductive film 13 made of metal or metal compound will be called "metal-containing film" in some cases, for the sake of convenience. The conductive film 13 may be composed of a plurality of metal-containing films. In this capacitor, at least the conductive film 13 functions as bottom electrode. If the PSZTR film 11 is in effect a conductor, it will function as bottom electrode, too.

Figure 2D:
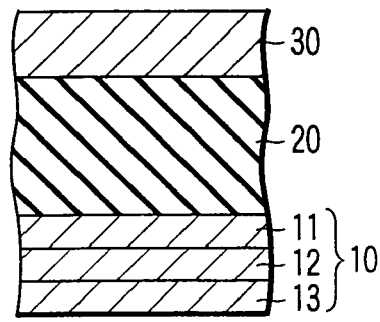

FIG. 2D depicts a capacitor whose lower structure 10 is a stacked film composed of a PSZTR film 11, a conductive film (SRO film) 12, and a conductive film 13 (metal film or metal compound film). The conductive film 13 is identical to the film 13 incorporated in the capacitor of FIG. 2C. In the capacitor shown in FIG. 2D, at least the conductive films 12 and 13 function as bottom electrode. The PSZTR film 11 may be, in effect, a conductor. If this is the case, the PSZTR 11 film will serve as bottom electrode, too.

FIGS. 3A to 3D are sectional views schematically depicting, respectively, capacitors 3 according to other embodiments of this invention.

Figure 3A:
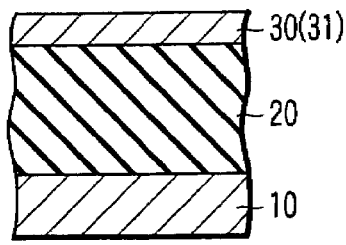
FIGS. 3A to 3D are sectional views schematically showing, respectively, capacitors according to an embodiment of the invention.

FIG. 3A shows a capacitor whose upper structure 30 is a PSZTR film 31. A dielectric (PZT) film 20 is formed on the lower structure 10. The PSZTR film 31 is formed on the dielectric film 20. In this capacitor, the PSZTR film 31 functions as top electrode.

Figure 3B:
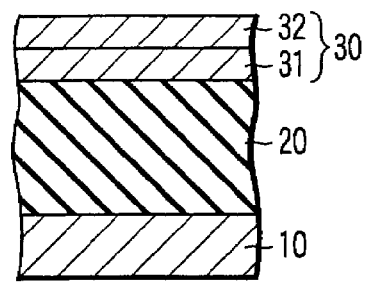

FIG. 3B illustrates a capacitor whose upper structure 30 is a stacked film composed of a PSZTR film 31 and a conductive film 32. The conductive film 32 contains Sr, Ru and O. A representative example of the conductive film 32 is an SRO ($SrRuO_3$) film. In this capacitor, at least the conductive film 32 serves as top electrode. The PSZTR film 31 may be a conductor in effect. In this case, the PSZTR film 31 functions as top electrode, too.

Figure 3C:
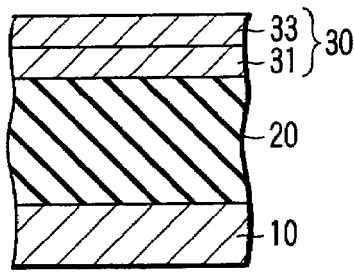

FIG. 3C shows a capacitor whose upper structure 30 is a stacked film composed of a PSZTR film 31 and a conductive film 33. The conductive film 33 is a metal film or a metal compound film. The conductive film 33 is similar to the conductive film 13 incorporated in the capacitor of FIG. 2C. In the capacitor shown in FIG. 3C, at least the conductive film 33 functions as top electrode. If the PSZTR film 31 is in effect a conductor, it will function as top electrode, too.

Figure 3D:
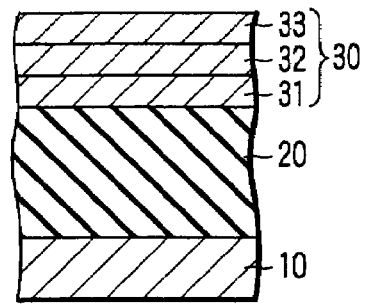

FIG. 3D depicts a capacitor whose upper structure 30 is a stacked film composed of a PSZTR film 31, a conductive film (SRO film) 32, and a conductive film 33 (metal film or metal compound film). The conductive film 33 is similar to the film 13 incorporated in the capacitor of FIG. 2C. In this capacitor of FIG. 3D, at least the conductive films 32 and 33 function as top electrode. The PSZTR film 31 may be, in effect, a conductor. In this case, the PSZTR 31 film will serve as top electrode, too.

Note that the capacitors shown in FIGS. 2A to 2D are characterized mainly by the lower structure 10, and the upper structure 30 may have any configuration desired. On the other hand, the capacitors shown in FIGS. 3A to 3D are characterized mainly by the upper structure 30, and the lower structure 10 may have any configuration desired. Thus, it is of course possible to combine any one of the lower structures 10 shown in FIGS. 2A to 2D with one of the upper structures 30 illustrated in FIGS. 3A to 3D.

In any capacitors shown in FIGS. 2A to 2D and FIGS. 3A to 3D, the PSZTR film and PZT film has main orientation direction of (111).

Some fundamental methods of manufacturing the capacitor 3 shown in FIG. 1 will be described.

Figure 4A:
FIGS. 4A to 4C are sectional views schematically explaining a method of manufacturing a capacitor according to an embodiment of the invention.
Figure 4B:
Figure 4C:
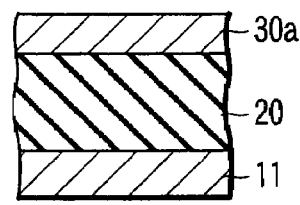

FIGS. 4A to 4C are sectional views schematically explaining the first method of manufacturing the capacitor. First, as shown in FIG. 4A, an amorphous SRO film 15 is formed by sputtering and an amorphous PZT film 25 is formed on the amorphous SRO film 15 also by sputtering. Then, the amorphous SRO film 15 and the amorphous PZT film 25 are heat-treated, reacting with each other and forming a crystallized PSZTR film 11 as is illustrated in FIG. 4B. Next, as shown in FIG. 4C, an amorphous PZT film is formed on the PSZTR film 11 by means of sputtering or the like. Heat treatment is then performed, crystallizing the amorphous PZT film. Thereafter, an upper-structure film 30a is formed on the PZT film 20 now crystallized. Amorphous PZT films may be repeatedly deposited and crystallized. Further, the upper-structure film may be formed before the amorphous PZT film is crystallized. In other words, the amorphous PZT film may be crystallized after the upper-structure film is formed.

Figure 5A:
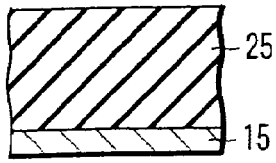
FIGS. 5A to 5C are sectional views schematically explaining a method of manufacturing a capacitor according to an embodiment of the invention.
Figure 5B:
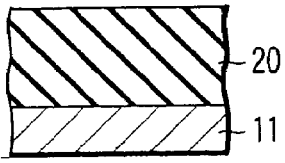
Figure 5C:
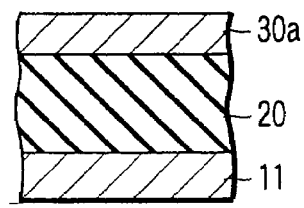

FIGS. 5A to 5C are sectional views schematically explaining the second method of manufacturing the capacitor. First, as shown in FIG. 5A, an amorphous SRO film 15 is formed by sputtering and an amorphous PZT film 25 is formed on the amorphous SRO film 15 also by sputtering. Next, heat treatment is carried out, making the amorphous SRO film 15 react with the lower portion of the amorphous PZT film 25 (particularly, that portion of the film 25 which is close to the interface between the films 15 and 25), thus forming a crystallized PZT film 11 as shown in FIG. 5B. During the heat treatment, the upper portion of the amorphous PZT film 25 is crystallized, too, forming a crystallized PZT film 20. Then, as shown in FIG. 5C, an upper-structure film 30a is formed on the crystallized PZT film 20.

Figure 6A:
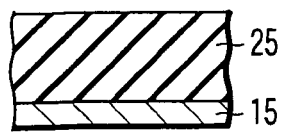
FIGS. 6A to 6C are sectional views schematically explaining a method of manufacturing a capacitor according to an embodiment of the invention.
Figure 6B:
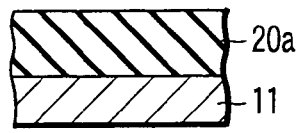
Figure 6C:
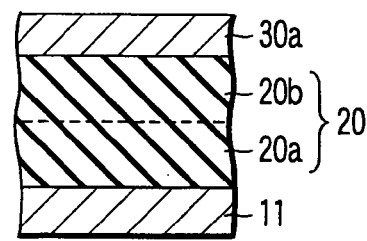

FIGS. 6A to 6C are sectional views schematically explaining third method of manufacturing the capacitor. The steps shown in FIGS. 6A and 6B are basically the same as those illustrated in FIGS. 5A and 5B. That is, an amorphous SRO film 15 and an amorphous PZT film 25 are formed and heat-treated, thus providing a crystallized PSZTR film 11 and a crystallized PZT film 20a. Next, sputtering or the like is carried out, forming an amorphous PZT film on the crystallized PZT film 20a as illustrated in FIG. 6C. Heat treatment is then performed, crystallizing the PZT film. Thereafter, an upper-structure film 30a is formed on the PZT film 20b thus crystallized.

In the first to third methods described above, heat treatment converts the whole amorphous SRO film 15 to a PSZTR film 11. Instead, the upper and lower portions of the amorphous SRO film 15 may be converted to a PSZTR film 11 and a crystallized SRO film. In this case, such a lower structure 10 as depicted in FIG. 2B can be obtained. In the first to third methods, the amorphous SRO film 15 is first formed. Alternatively, a metal film or a metal compound film is first formed and the amorphous SRO film 15 may then formed on the metal film or the metal compound film. If this is the case, such a lower structure 10 as shown in FIG. 2C or 2D can be provided.

Figure 7A:
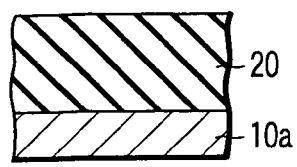
FIGS. 7A to 7C are sectional views schematically explaining a method of manufacturing a capacitor according to an embodiment of the invention.
Figure 7B:
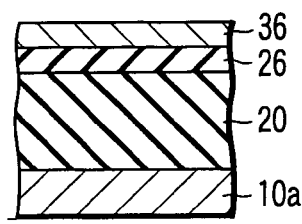
Figure 7C:
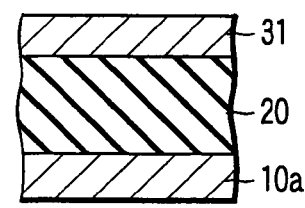

FIGS. 7A to 7C are sectional views schematically explaining the fourth method of manufacturing the capacitor. First, an amorphous PZT film is formed on a lower-structure film 10a by means of sputtering or the like, as is shown in FIG. 7A. Then, heat treatment is performed, crystallizing the amorphous PZT film and, thus, forming a crystallized PZT film 20, as is illustrated in FIG. 7A. Note that the PZT film 20 may be formed by repeating a process several times, each time depositing amorphous PZT film and crystallizing the same. Next, as shown in FIG. 7B, an amorphous PZT film 26 is formed on the crystallized PZT film 20 and an amorphous SRO film 36 is formed on the amorphous PZT film 26. Further, heat treatment is performed, causing the amorphous PZT film 26 and the amorphous SRO film 36 to react with each other, thereby forming a crystallized PSZTR film 31, as is illustrated in FIG. 7C.

Figure 8A:
FIGS. 8A to 8C are sectional views schematically explaining a method of manufacturing a capacitor according to an embodiment of the invention.
Figure 8B:
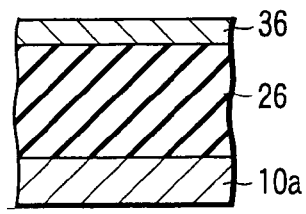
Figure 8C:
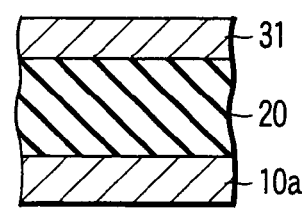

FIGS. 8A to 8C are sectional views schematically explaining the fifth method of manufacturing the capacitor. First, a lower-structure film 10a is formed as shown in FIG. 8A. Then, sputtering or the like is performed, forming an amorphous PZT film 26 on the lower-structure film 10a and an amorphous SRO film 36 on the amorphous PZT film 26, as is illustrated in FIG. 8B. Next, heat treatment is carried out, causing the upper portion of the amorphous PZT film 26 (particularly, the portion near the interface with the amorphous SRO film 36) to react with the amorphous SRO film 36, thus forming a crystallized PSZTR film 31, as is illustrated in FIG. 8C. During this heat treatment the lower portion of the amorphous PZT film 26 is crystallized, providing a crystallized PZT film 20.

Figure 9A:
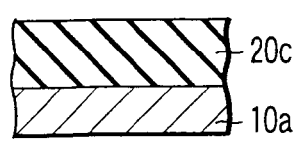
FIGS. 9A to 9C are sectional views schematically explaining a method of manufacturing a capacitor according to an embodiment of the invention.
Figure 9B:
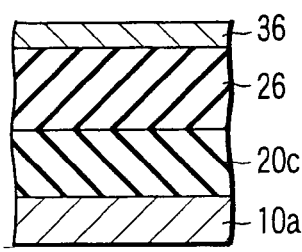
Figure 9C:
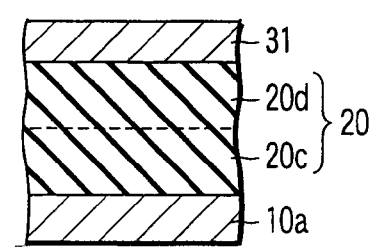

FIGS. 9A to 9C are sectional views schematically explaining the sixth method of manufacturing the capacitor. The step shown in FIG. 9A is basically the same as the one illustrated in FIG. 7A. In this step, a lower-structure film 10a and a crystallized PZT film 20c are formed. Next, sputtering or the like is performed, forming an amorphous PZT film 26 on the PZT film 20c and an amorphous SRO film 36 on the amorphous PZT film 26 as is illustrated in FIG. 9B. Then, heat treatment is carried out, causing the upper portion of the amorphous PZT film 26 to react with the amorphous SRO film 36, thereby forming a crystallized PSZTR film 31 as shown in FIG. 9C. During the heat treatment, the lower portion of the amorphous PZT film 26 is crystallized, too, forming a crystallized PZT film 20d.

In the fourth to sixth methods described above, the entire amorphous SRO film 36 is converted to a PSZTR film 31. Instead, the lower and upper portions of the amorphous SRO film 36 may be converted to a PSZTR film 31 and a crystallized SRO film, respectively. In this case, such an upper structure 30 as shown in FIG. 3B can be obtained. The film finally formed in the fourth to sixth methods is the PSZTR film 31. Nonetheless, a metal film or a metal compound film may be formed on the PSZTR film 31. Alternatively, a metal film or a metal compound film may be formed on the amorphous SRO film 36 before the SRO film 36 is crystallized. In either case, an upper structure 30 of the type shown in FIG. 3C or 3D can be provided.

The first to third methods of manufacturing the capacitor are concerned mainly with the steps of forming the PSZTR film 11 and PZT film 20. The step of forming the upper-structure film 30a may be replaced by any other. The fourth to sixth methods of manufacturing the capacitor are concerned mainly with the steps of forming the PSZTR film 31 and PZT film 20. The step of forming the lower-structure film 10a may be replaced by any other. Thus, any one of the first to third methods and any one of the fourth to sixth methods can, of course, be combined to form the capacitor.

FIGS. 10A and 10B are sectional views schematically explaining the seventh method of manufacturing the capacitor. First, as shown in FIG. 10A, an amorphous SRO film 17, an amorphous PZT film 27 and an amorphous SRO film 37 are formed by sputtering or the like, one upon another in the order they are mentioned. Then, heat treatment is performed, causing the lower portion of the amorphous PZT film 27 to react with the amorphous SRO film 17 and causing the upper portion of the amorphous PZT film 27 to react with the amorphous SRO film 37. A crystallized PSZTR film 11 and a crystallized PSZTR film 31 are thereby formed as is illustrated in FIG. 10B. At the same time the intermediate portion of the amorphous PZT film 27 is crystallized, too, forming a crystallized PZT film 20.

As indicated earlier, the upper and lower portions of the amorphous SRO film 17 may be changed to a PSZTR film 11 and a crystallized SRO film, respectively, by means of heat treatment. Alternatively, the lower and upper portions of the amorphous SRO film 37 may be changed to a PSZTR film 31 and a crystallized SRO film, respectively, also by means of heat treatment. Further, a metal film or a metal compound film may be formed beneath the PSZTR film 11. Still further, a metal film or a metal compound film may be formed on the PSZTR film 31.

Note that the heat treatment should be performed preferably at 450 to 700° C. to form a PSZTR film in the first to seventh methods described above.

FIGS. 11A to 11C are sectional views schematically explaining the eighth method of manufacturing the capacitor. An amorphous film (amorphous PSZTR film) containing Pb, Sr, Zr, Ti, Ru and O is first formed. Heat treatment is carried out, crystallizing the amorphous PSZTR film. A crystallized PSZTR film 11 is thereby formed as shown in FIG. 11A. Then, a crystallized PZT film 20 is formed on the PSZTR film 11 as illustrated in FIG. 11B. As shown in FIG. 11C, an upper-structure film 30a is formed on the PZT film 20. The PZT film 20 and the upper-structure film 30a may be formed by any one of the various methods described above.

FIGS. 12A to 12C are sectional views schematically explaining the ninth method of manufacturing the capacitor. First, a lower-structure film 10a is formed as shown in FIG. 12A. Then, a crystallized PZT film 20 is formed on the lower-structure film 10a as is illustrated in FIG. 12B. The lower-structure film 10a and the crystallized PZT film 20 can be formed by any one of the various methods described above. Next, an amorphous film (amorphous PSZTR film) containing Pb, Sr, Zr, Ti, Ru and O is formed on the crystallized PZT film 20. Heat treatment is performed, crystallizing the amorphous PSZTR film. A crystallized PSZTR film 31 is thereby formed.

In the eighth and ninth methods, the amorphous PSZTR film can be formed by various processes such as sputtering, sol-gel process, MOCVD and the like. If sputtering is employed, it suffices to use a target that has an adjusted composition ratio between Pb, Sr, Zr, Ti, Ru and O. It is desirable to perform the heat treatment at 450 to 700° C. to crystallize the amorphous PSZTR film. A crystallized PSZTR film may be formed at high temperature, instead of crystallizing an amorphous PSZTR film. As in the methods already described, a metal film or a metal compound film may be formed beneath the PSZTR film 11 or upon the PSZTR film 31.

Thus far, the patterning step included in the first to ninth methods has not been explained. The patterning step may be carried out after films constituting the capacitor have been formed.

In the above-described embodiments, the film containing Pb, Sr, Zr, Ti, Ru and O (i.e., PSZTR film) is formed near the upper and/or lower surface of the PZT film. The PSZTR film contains the constituent elements (Sr, Ru and O) of the SRO and the constituent element (Pb, Zr, Ti and O) of the PZT film. In the conventional capacitor, the elements contained in the PZT film are different from those contained in the SRO film, except oxygen, as pointed out above, the electric charge is therefore likely to accumulate in the interface between the PZT film and the SRO film. The capacitors according to the embodiments of this invention are free of this problem, because the PSZTR film contains the elements constituting the PZT film. Hence, the capacitors of this invention would not be deteriorated in terms of retention characteristic or imprint characteristic. They can have high reliability and good characteristics.

In the above-described embodiments, when the amorphous SRO film and the amorphous PZT film react with each other by the heat treatment to form a crystallized PSZTR film, the PSZTR film near the PZT film can have a similar composition to that of the PZT film. That is, the portion of the PSZTR film, which is nearer the PZT film can have a composition more similar to that of the PZT film than any other portion. Continuity between the PSZTR film and the PZT film can therefore be ensured. This can minimize the above-mentioned problem.

Examples of the embodiments of the present invention will be described below.

EXAMPLE 1

First, an amorphous SRO film (0 to 10 nm thick) was formed on a Pt substrate by means of sputtering. Then, an amorphous PZT film (0 to 30 nm thick) was formed on the amorphous SRO film by sputtering, too. The Zr/Ti ratio (in number of atoms) in the amorphous PZT film was 40/60 or 30/70. Further, RTA (Rapid Thermal Annealing) was performed at 600 C for 30 seconds. During this heat treatment the amorphous SRO film and the amorphous PZT film reacted with each other, forming a crystallized PSZTR film.

Figure 14:
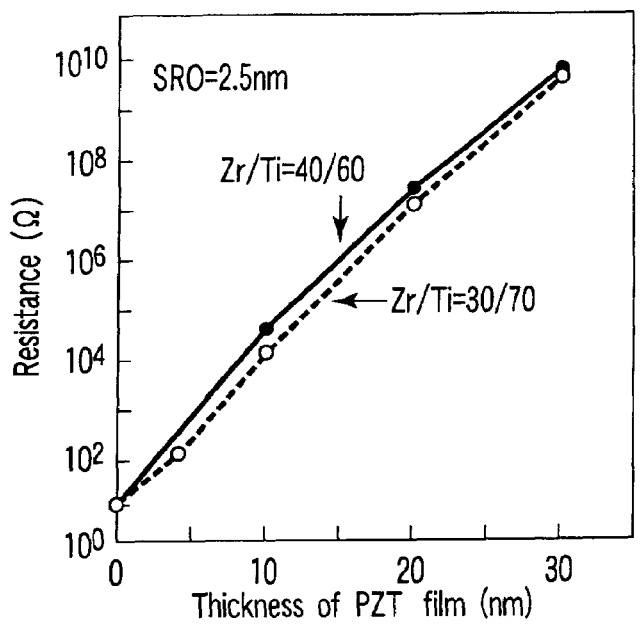
FIG. 14 is a diagram showing the electrical characteristic of a PSZTR film according to an embodiment of the invention.

FIGS. 13 and 14 are diagrams that represent the electrical characteristics (resistances) of PSZTR films thus formed. The resistance of PSZTR film was measured by two-probe method. To be more specific, the two probes were set in contact with the Pt substrate and the PSZTR film, respectively, and the resistance between the probes was detected.

FIG. 13 shows the measuring results obtained of PSZTR films which were identical in the thickness of the amorphous PZT film, i.e., 10 nm, but different in the thickness of the amorphous SRO film. As FIG. 13 reveals, the thicker the amorphous SRO film, the lower the resistance, and the resistance is almost constant if the amorphous SRO film is 2 nm or more thick.

FIG. 14 depicts the measuring results obtained of PSZTR films which were identical in the thickness of the amorphous SRO film, i.e., 2.5 nm, but different in the thickness of the amorphous PZT film. As FIG. 14 indicates, the resistance is almost proportional to the thickness of the amorphous PZT film. The resistance that the PSZTR film has when the amorphous PZT film is 30 nm thick is almost equal to the resistance of a PZT film (10 nm thick) that has been crystallized without forming an SRO film.

The measuring results of FIGS. 13 and 14 teach that a PSZTR film is formed as the elements contained in the SRO film diffuse into the PZT film and the elements of the PZT film diffuse into the SRO film during the heat treatment. Due to this mutual diffusion, the concentrations of Sr and Ru gradually decrease toward the upper surface of the PSZTR film, and the concentrations of Pb, Zr and Ti gradually decrease toward the lower surface of the PSZTR film. The resistance of the PSZTR film varies, depending upon its composition.

The surfaces of the PSZTR films thus formed were observed with a SEM (Scanning Electron Microscope). Of these PSZTR films crystallized, any formed by heat-treating only an amorphous SRO film had foreign-matter particles of sizes ranging from 1 μm to 10 μm. These particles are considered to be of ruthenium dioxide, strontium oxide, and strontium carbonate generated as amorphous SRO. reacts with carbon dioxide contained in the air. Of the PSZTR films crystallized, any formed by heat-treating an amorphous SRO film and an amorphous PZT film had no foreign-matter particles. Such foreign-matter particles render the device defective. Thus, the use of a PSZTR film in place of an SRO film can help to enhance the yield of the device.

EXAMPLE 2

Using a Ti film as seed layer, a Pt film was formed on a semiconductor wafer by sputtering to a thickness of 100 nm. An amorphous SRO film was then formed on the Pt film by sputtering, too. Further, an amorphous PZT film was formed on the SRO film by means of sputtering. Note that the amorphous PZT had a Zr/Ti composition ratio of 30/70. RTA was performed on the resultant structure at 600° C. for 30 seconds. During this heat treatment, the amorphous SRO film and the amorphous PZT film reacted with each other, forming a crystallized PSZTR film. An amorphous PZT film was then formed by sputtering. The resultant structure was subjected to heat treatment (RTA), at 600° C. for 30 seconds. The amorphous PZT film was thereby crystallized. Another amorphous PZT was then formed and crystallized in the same conditions. The PSZTR film and the PZT films, thus formed, had a total thickness of about 70 nm.

Next, an amorphous SRO film having a thickness of 10 nm was formed on the PZT film, by means of sputtering. A Pt film having a thickness of 50 nm was formed on the amorphous SRO film, also by sputtering. The resultant structure was subjected to heat treatment (RTA) at 600° C. for 30 seconds, thereby crystallizing the amorphous SRO film. Thereafter, the structure underwent recovery annealing in an electric furnace, at 600° C. for one hour.

As a result, a capacitor was manufactured. As FIG. 15 shows, the capacitor comprised a Pt film 101, a PSZTR film 102, a PZT film 103, an SRO film 104 and a Pt film 105.

Figure 15:
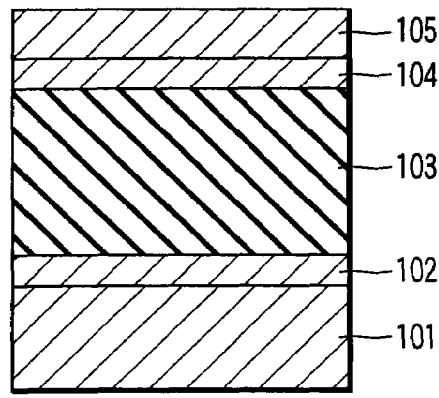
FIG. 15 is a sectional view schematically depicting a capacitor according to an embodiment of the invention.
Figure 16:
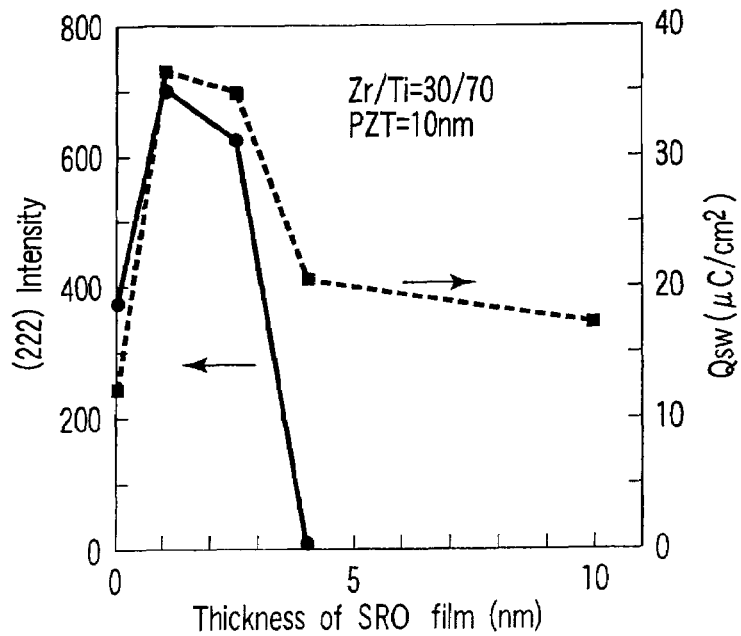
FIG. 16 is a diagram representing the diffraction intensity and polarization observed with a capacitor according to an embodiment of the invention.
Figure 17:
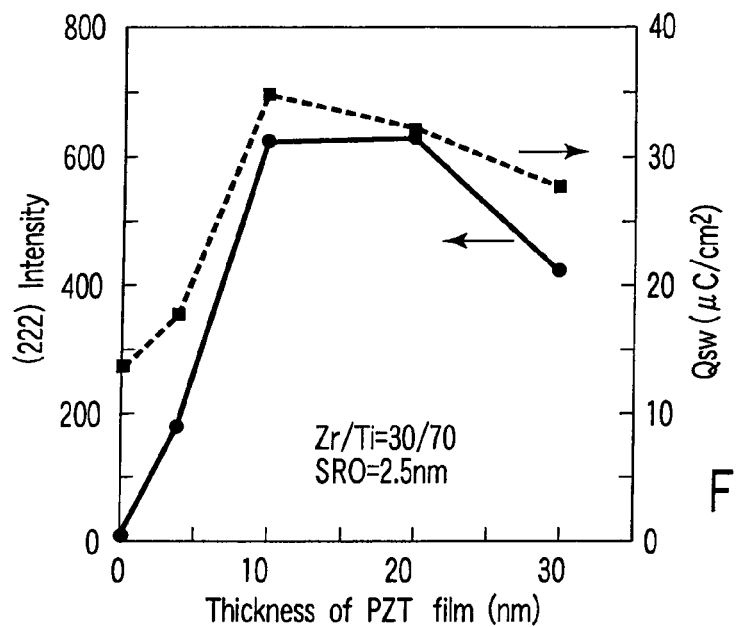
FIG. 17 is a diagram representing the diffraction intensity and polarization observed with a capacitor according to an embodiment of the invention.

FIGS. 16 and 17 are diagrams that represent the (222) diffraction intensity and polarization Qsw of capacitors of the type illustrated in FIG. 15. FIG. 16 shows the measurement result of the capacitors which were identical in the thickness of the amorphous PZT film, i.e., 10 nm, but different in the thickness of the amorphous SRO film. FIG. 17 shows the measurement result of the capacitors which were identical in the thickness of the amorphous SRO film, i.e., 2.5 nm, but different in the thickness of the amorphous PZT film.

As FIGS. 16 and 17 show, when the (222) intensity is high, that is the degree of the orientation of (111) direction of the PZT film is high, the polarization Qsw is large. As seen from FIG. 16, the polarization Qsw is large if the amorphous SRO film is about 2.5 nm or less thick. As FIG. 17 reveals, the polarization Qsw is large if the amorphous PZT film has a thickness ranging from about 10 nm to about 20 nm. In view of this, it is desired that the amorphous SRO film be 2.5 nm or less thick and that amorphous PZT film be 10 to 20 nm thick. The polarization Qsw does not greatly decrease even if the amorphous SRO film is about 10 nm thick. Hence, the amorphous SRO film may have a thickness of 10 nm or less. Moreover, the amorphous PZT film may have a thickness of 30 nm or less, because the polarization Qsw does not much decrease even if the amorphous PTZ film is about 30 nm thick. Note that the average composition of the PSZTR film is $Pb_{0.8}Sr_{0.2}Zr_{0.24}Ti_{0.56}Ru_{0.2}O_3$ if the amorphous SRO and amorphous PZT films are 2.5 nm and 10 nm thick, respectively.

EXAMPLE 3

The lower structure of a capacitor was formed in the same way as in Example 2. The amorphous SRO film was 2.5 nm thick, and the amorphous PZT film was 10 nm thick. Heat treatment was carried out at 650° C. to form a PSZTR film. The PZT film exhibited Zr/Ti composition ratio of 40/60.

After the PSZTR film was formed, an amorphous PZT film was formed by sputtering, to a thickness of 30 nm. The resultant structure was subjected to RTA at 650° C. for 30 seconds. The amorphous PZT film was thereby crystallized. Then, another amorphous PZT film was formed and crystallized in the same condition as the first PZT film. The PSZTR film and PZT films thus formed had a total thickness of about 70 nm. The average composition of the PSZTR film was $Pb_{0.8}Sr_{0.2}Zr_{0.32}Ti_{0.48}Ru_{0.2}O_3$.

Next, an amorphous SRO film was formed on the PZT film by means of sputtering to a thickness of 10 nm. A Pt film was formed on the SRO film by sputtering, to a thickness of 50 nm. The resultant structure was subjected to RTA at 650° C. for 30 seconds. The amorphous SRO film was thereby crystallized. The structure was subjected to recovery annealing in an electric furnace, at 650° C. for one hour. A capacitor of the structure shown in FIG. 15 was manufactured.

Figure 18:
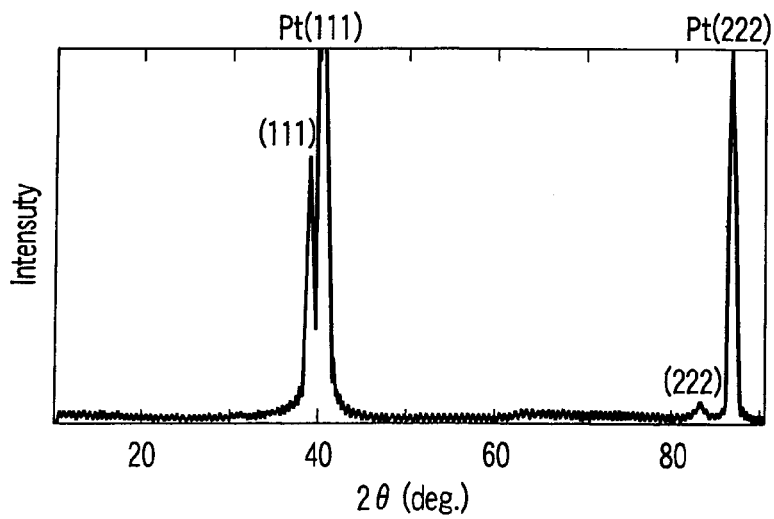
FIG. 18 is a diagram showing the X-ray diffraction pattern observed with a capacitor according to an embodiment of the invention.

FIG. 18 is a diagram that shows the X-ray diffraction pattern observed with the capacitor thus manufactured. As seen from FIG. 18, the orientation direction of the Pt film is (111), and the main orientation direction of the PZT film is (111). Hence, the main orientation direction of the lower structure, dielectric film and upper structure of the capacitor is (111).

Figure 19:
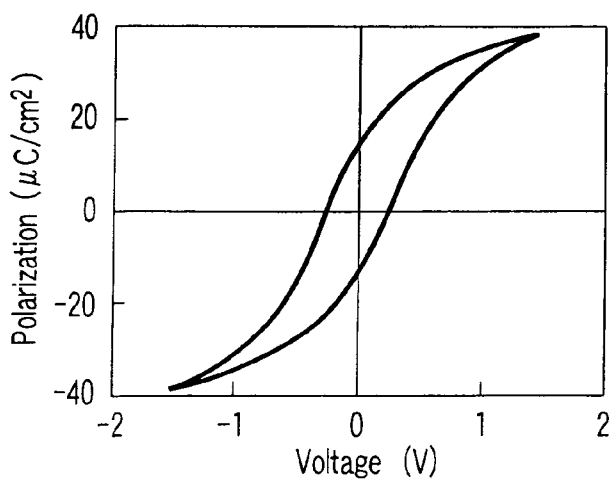
FIG. 19 is a diagram representing the hysteresis of a capacitor according to an embodiment of the invention.
Figure 20:
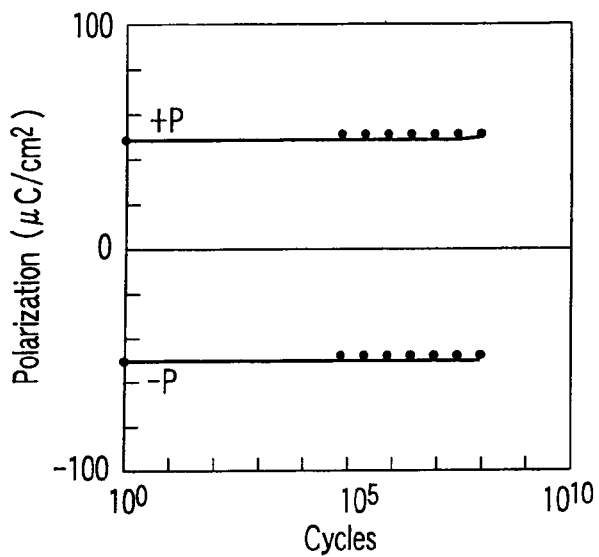
FIG. 20 is a diagram illustrating the fatigue characteristic of a capacitor according to an embodiment of the invention.

FIG. 19 is a diagram that represents the hysteresis of a capacitor described above. The capacitor exhibited a good hysteresis curve at the measuring voltage of 1.5 V. The polarization Qsw was about 22 $\mu C/cm^2$. FIG. 20 is a diagram that illustrates the fatigue characteristic of the capacitor. The fatigue characteristic remained good, even after data-writing/reading was repeated over $10^8$ times on the capacitor. This means that the capacitor excels in reliability.

EXAMPLE 4

A Pt film was formed on a semiconductor wafer by sputtering, to a thickness of 100 nm. An amorphous SRO film was formed on the Pt film by sputtering, too, to a thickness of 10 nm. The resultant structure was subjected to RTA at 650° C. for 30 seconds. During the heat treatment the amorphous SRO film was crystallized.

Next, a Ti film, an amorphous PZT film, an amorphous SRO film and a Pt film, which were 2.5 nm, 70 nm, 10 nm and 50 nm thick, respectively, were formed by sputtering, one upon another in the order they are mentioned. The resultant structure was subjected to RTA at 650° C. for 30 seconds. During this heat treatment, the upper portion of the amorphous PZT film reacted with the amorphous SRO film, forming a crystallized PSZTR film. During the heat treatment, too, the lower portion of the amorphous PZT film was crystallized. The resultant structure was subjected to recovery annealing in an electric furnace, at 650° C. for one hour.

Figure 21:
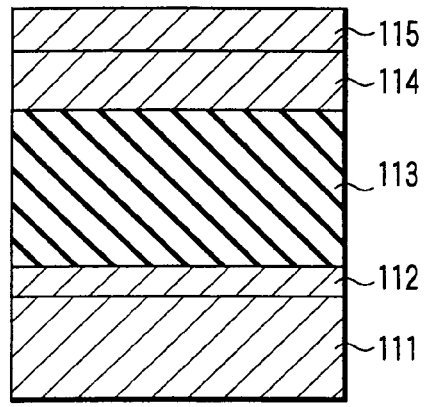
FIG. 21 is a sectional view showing a capacitor according to an embodiment of the invention.

As a result, a capacitor was manufactured. As FIG. 21 shows, the capacitor comprised a Pt film 111, an SRO film 112, a PZT film 113, a PSZTR film 114 and a Pt film 115.

Figure 22:
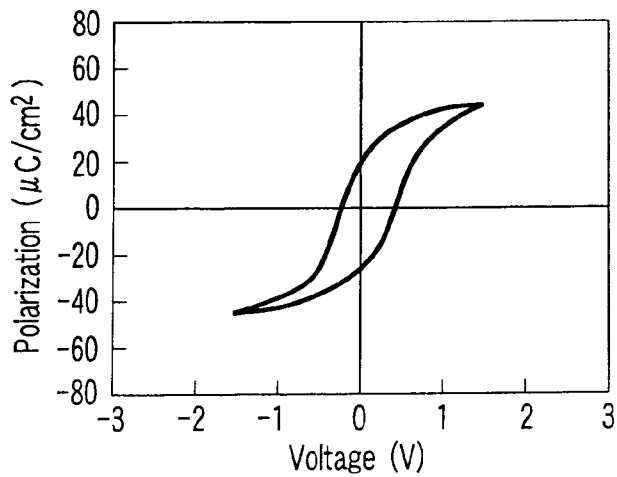
FIG. 22 is a diagram representing the hysteresis of a capacitor according to an embodiment of the invention.
Figure 23:
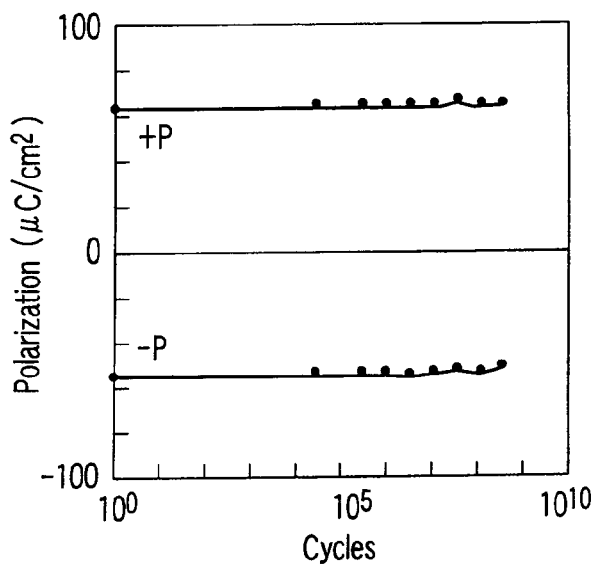
FIG. 23 is a diagram illustrating the fatigue characteristic of a capacitor according to an embodiment of the invention.

FIG. 22 is a diagram that represents the hysteresis of the capacitor thus manufactured. The capacitor exhibited a good hysteresis curve at the measuring voltage of 1.5 V. The polarization Qsw was about 30 $\mu C/cm^2$. FIG. 23 is a diagram that depicts the fatigue characteristic of the capacitor. The fatigue characteristic remained good, even after data-writing/reading was repeated over $10^8$ times on the capacitor. This means that this capacitor, or Example 4, excels in reliability, too.

EXAMPLE 5

The lower structure of a capacitor was formed in the same way as in Example 2. The amorphous SRO film was 2.5 nm thick, and the amorphous PZT film was 10 nm thick. Heat treatment was carried out at 650° C. to form a PSZTR film.

The PZT film had Zr/Ti composition ratio of 40/60. After the PSZTR film was formed, an amorphous PZT film was formed by sputtering, to a thickness of 25 nm. The resultant structure was subjected to RTA at 650° C. for 30 seconds. The amorphous PZT film was thereby crystallized. Then, another amorphous PZT film was formed and crystallized in the same condition as the first PZT film.

Then, an amorphous PZT film, an amorphous SRO film and a PT film, which were 10 nm, 2.5 nm and 50 nm thick, respectively, were formed by sputtering, in the order they are mentioned. The resultant structure was subjected to RTA at 650° C. for 30 seconds. During this heat treatment the amorphous PZT film and the amorphous SRO film reacted with each other, forming a crystallized PSZTR film. The resultant structure was subjected to recovery annealing in an electric furnace, at 650° C. for one hour.

Figure 24:
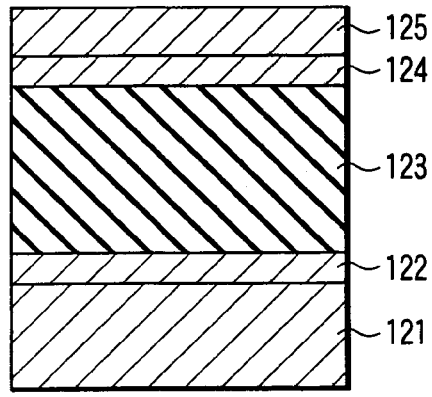
FIG. 24 is a sectional view showing a capacitor according to an embodiment of the invention.

A capacitor was thereby manufactured which had the structure shown in FIG. 24. As FIG. 24 shows, this capacitor comprised a Pt film 121, a PSZTR film 122, a PZT film 123, a PSZTR film 124 and a Pt film 125.

Figure 25:
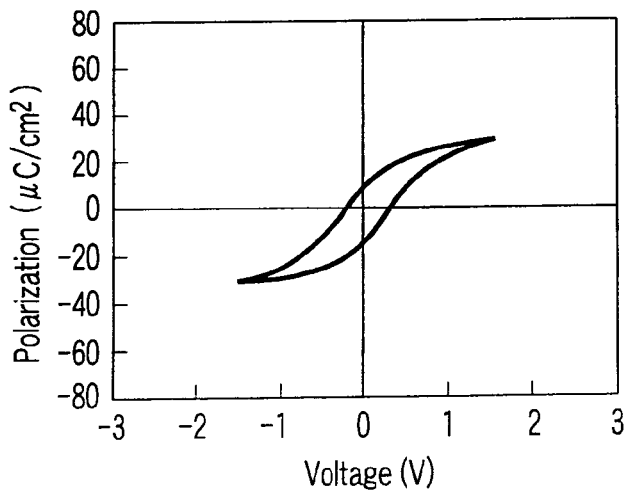
FIG. 25 is a diagram representing the hysteresis of a capacitor according to an embodiment of the invention.

FIG. 25 is a diagram that represents the hysteresis of the capacitor thus manufactured. The capacitor exhibited a good hysteresis curve at the measuring voltage of 1.5 V. The polarization Qsw was about 13 $\mu C/cm^2$. This capacitor excels in characteristics, too.

COMPARATIVE EXAMPLE

A Pt film was formed on a semiconductor wafer by sputtering, to a thickness of 100 nm. An amorphous SRO film was formed on the Pt film by sputtering, too, to a thickness of 10 nm. The resultant structure was subjected to RTA at 650° C. for 30 seconds. During the heat treatment the amorphous SRO film was crystallized. Next, a Ti film and an amorphous PZT film, which were 2.5 nm and 35 nm thick, respectively, were formed by sputtering, in the order they are mentioned. The resultant structure was subjected to RTA at 650° C. for 30 seconds. During this heat treatment, the amorphous PZT film was crystallized. Another amorphous PZT was formed and crystallized in the same conditions. Next, an amorphous SRO film and a Pt film, which were 10 nm and 50 nm thick, respectively, were formed by sputtering, in the order they are mentioned. The structure was subjected to RTA at 650° C. for 30 seconds. This heat treatment crystallized the amorphous SRO film. The resultant structure was subjected to recovery annealing in an electric furnace, at 650° C. for one hour. A capacitor was thereby manufactured.

The X-ray diffraction pattern of the capacitor thus made was examined. The examination showed that the orientation direction of the PZT film was at random. The capacitor was examined for its hysteresis, too. The capacitor was found to exhibit no good hysteresis. The polarization was insufficient. The comparative example could not attain good characteristics, probably because it had no PSZTR film at all.

Additional advantages and modifications will readily occur to those skilled in the art. Therefore, the invention in its broader aspects is not limited to the specific details and representative embodiments shown and described herein. Accordingly, various modifications may be made without departing from the sprint or scope of the general inventive concept as defined by the appended claims and their equivalents.

What is claimed is:

1. A method of manufacturing a semiconductor device, comprising:
    forming a capacitor above a semiconductor substrate, the capacitor including a dielectric film containing Pb, Zr, Ti and O,
    wherein forming the capacitor includes forming a crystallized film which contains Pb, Sr, Zr, Ti, Ru and O, and wherein the film which contains Pb, Sr, Zr, Ti, Ru and O has a perovskite-type crystal structure and is represented by
    $Pb_xSr_{(1-x)}[Zr,Ti]_xRu_{(1-x)}O_3$ in which x is 0.8 to 0.9.

2. The method according to claim 1, wherein forming the crystallized film which contains Pb, Sr, Zr, Ti, Ru and O comprises:
    forming an amorphous film which contains Pb, Sr, Zr, Ti, Ru and O; and
    crystallizing the amorphous film which contains Pb, Sr, Zr, Ti, Ru and O.

3. A method of manufacturing a semiconductor device, comprising:
    forming a capacitor above a semiconductor substrate, the capacitor including a dielectric film containing Pb, Zr, Ti and O,
    wherein forming the capacitor includes forming a crystallized film which contains Pb, Sr, Zr, Ti, Ru and O, and wherein forming the crystallized film which contains Pb, Sr, Zr, Ti, Ru and O comprises:
        forming an amorphous film which contains Sr, Ru and O;
        forming an amorphous film which contains Pb, Zr, Ti and O, on the amorphous film which contains Sr, Ru and O; and
        causing at least an upper portion of the amorphous film containing Sr, Ru and O to react with at least a lower portion of the amorphous film containing Pb, Zr, Ti and O.

4. A method of manufacturing a semiconductor device, comprising:
    forming a capacitor above a semiconductor substrate, the capacitor including a dielectric film containing Pb, Zr, Ti and O,
    wherein forming the capacitor includes forming a crystallized film which contains Pb, Sr, Zr, Ti, Ru and O, and wherein forming the crystallized film which contains Pb, Sr, Zr, Ti, Ru and O comprises:
        forming an amorphous film which contains Pb, Zr, Ti and O;
        forming an amorphous film which contains Sr, Ru and O, on the amorphous film which contains Pb, Zr, Ti and O; and
        causing at least a lower portion of the amorphous film containing Sr, Ru and O to react with at least an upper portion of the amorphous film containing Pb, Zr, Ti and O.

5. A method of manufacturing a semiconductor device, comprising:
    forming a capacitor above a semiconductor substrate, the capacitor including a dielectric film containing Pb, Zr, Ti and O,
    wherein forming the capacitor includes forming a crystallized film which contains Pb, Sr, Zr. Ti, Ru and O, and, wherein forming the crystallized film which contains Pb, Sr, Zr, Ti, Ru and O comprises:
        forming an amorphous film which contains Pb, Sr, Zr, Ti, Ru and O; and
        crystallizing the amorphous film which contains Pb, Sr, Zr, Ti, Ru and O.

* * * * *